United States Patent
Bedell et al.

(10) Patent No.: US 8,946,054 B2
(45) Date of Patent: Feb. 3, 2015

(54) CRACK CONTROL FOR SUBSTRATE SEPARATION

(71) Applicant: International Business Machines Corporation, Armonk, NY (US)

(72) Inventors: Stephen W. Bedell, Wappingers Falls, NY (US); Cheng-Wei Cheng, White Plains, NY (US); Devendra K. Sadana, Pleasantville, NY (US); Katherine L. Saenger, Ossining, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/866,669

(22) Filed: Apr. 19, 2013

(65) Prior Publication Data
US 2014/0315389 A1    Oct. 23, 2014

(51) Int. Cl.
*H01L 21/30* (2006.01)
*H01L 21/02* (2006.01)
*H01L 21/306* (2006.01)

(52) U.S. Cl.
CPC ........ *H01L 21/02109* (2013.01); *H01L 21/306* (2013.01)
USPC ............ 438/458; 257/E21.214; 257/E21.568; 438/455; 438/759

(58) Field of Classification Search
USPC ........... 257/E21.214, E21.568; 438/455, 458, 438/759
See application file for complete search history.

(56) References Cited

U.S. PATENT DOCUMENTS

| | | | |
|---|---|---|---|
| 7,736,994 B2 | 6/2010 | Reynaud et al. | |
| 2008/0268621 A1 | 10/2008 | Reynaud et al. | |
| 2010/0181653 A1 | 7/2010 | Aulnette et al. | |
| 2011/0092051 A1* | 4/2011 | Moriceau et al. | 438/458 |
| 2012/0217622 A1 | 8/2012 | Bedell et al. | |
| 2012/0282782 A1 | 11/2012 | Bedell et al. | |
| 2013/0292691 A1* | 11/2013 | Henley et al. | 257/76 |

FOREIGN PATENT DOCUMENTS

| | | |
|---|---|---|
| AP | EP2157602 A1 | 2/2010 |
| CN | 102388466 A | 3/2012 |
| EP | 1532667 A2 | 5/2005 |
| JP | 2010199617 A | 9/2010 |
| JP | 4846363 B2 | 12/2011 |
| JP | 4975640 B2 | 7/2012 |
| JP | 5026685 B2 | 9/2012 |

* cited by examiner

*Primary Examiner* — Asok K Sarkar
(74) *Attorney, Agent, or Firm* — Tutunjian & Bitetto, P.C.; Louis J. Percello

(57) ABSTRACT

A method for separating a layer for transfer includes forming a crack guiding layer on a substrate and forming a device layer on the crack-guiding layer. The crack guiding layer is weakened by exposing the crack-guiding layer to a gas which reduces adherence at interfaces adjacent to the crack guiding layer. A stress inducing layer is formed on the device layer to assist in initiating a crack through the crack guiding layer and/or the interfaces. The device layer is removed from the substrate by propagating the crack.

20 Claims, 6 Drawing Sheets

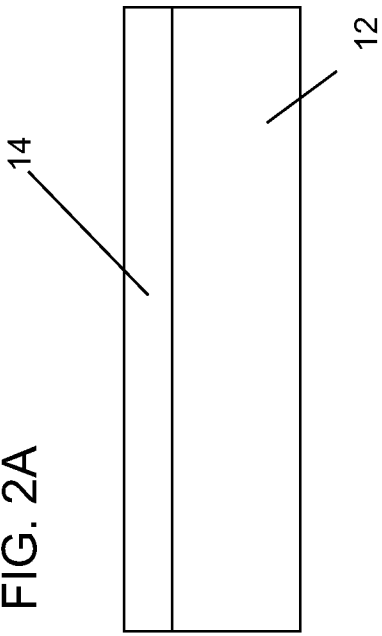
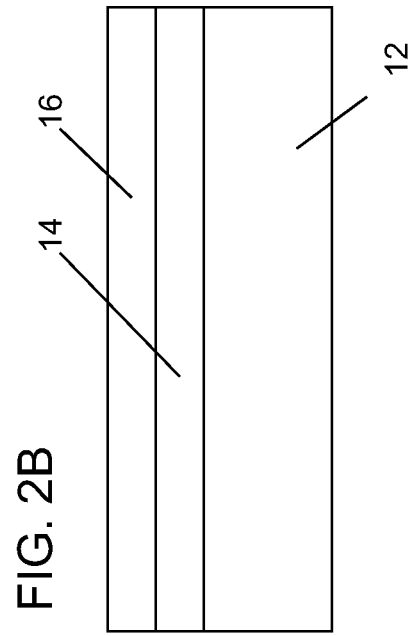
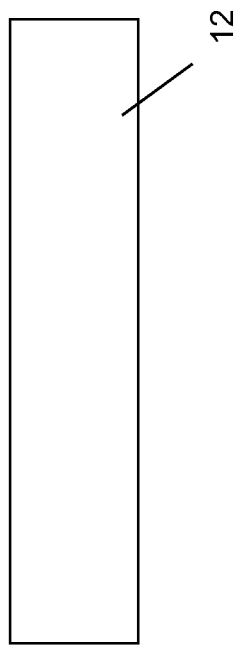

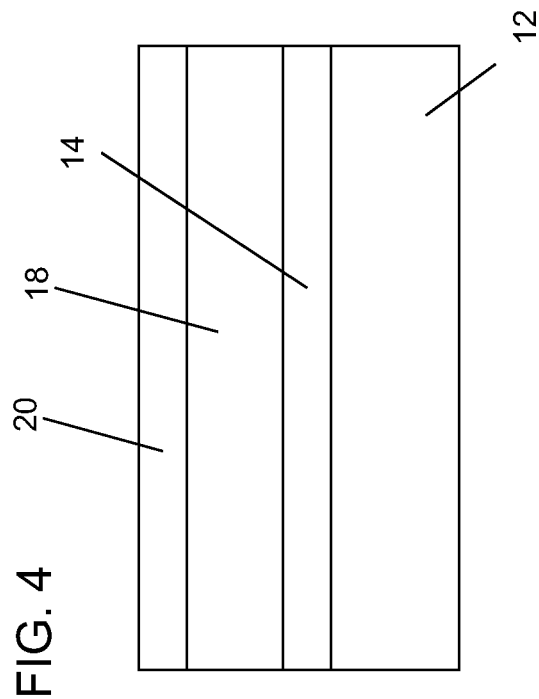
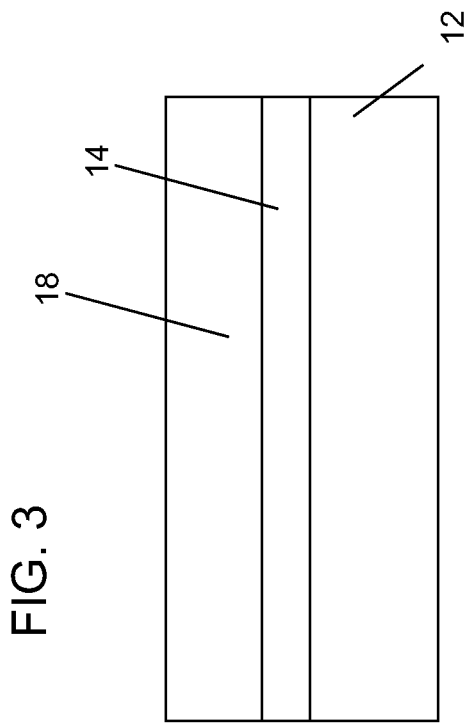

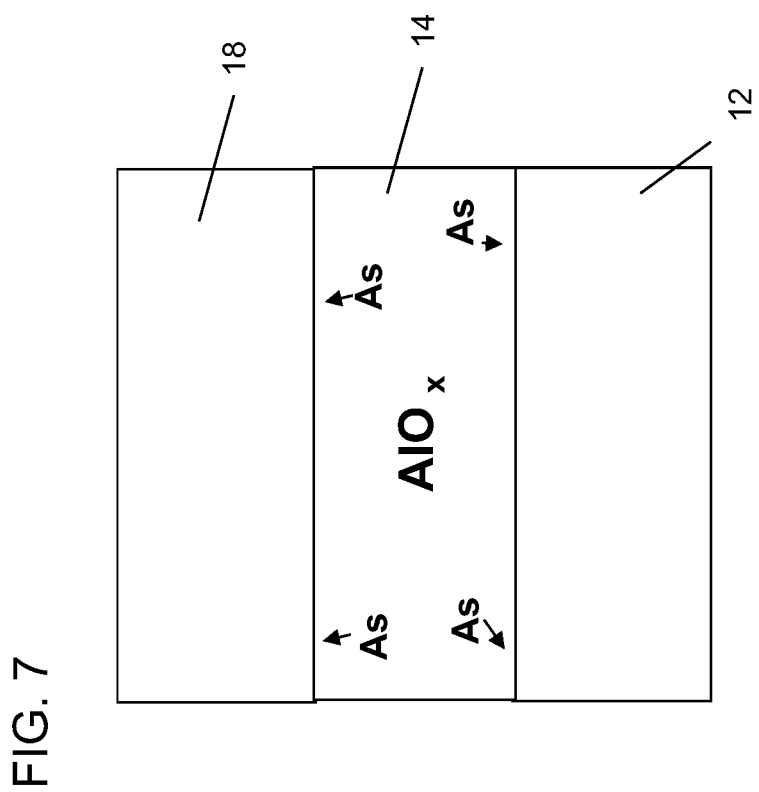

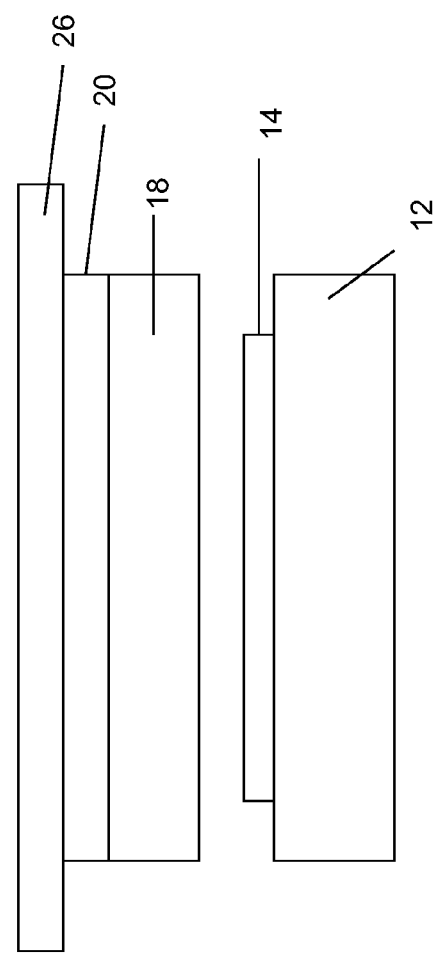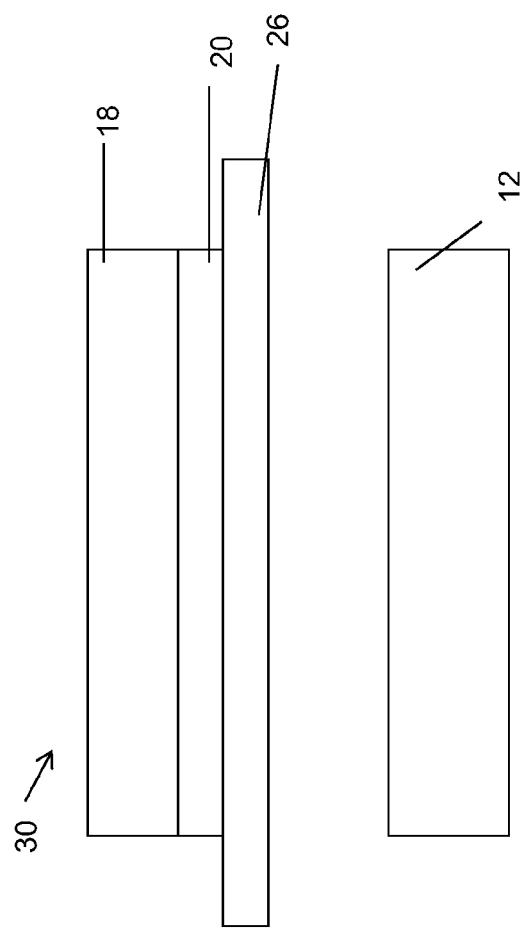

US 8,946,054 B2

CRACK CONTROL FOR SUBSTRATE SEPARATION

BACKGROUND

1. Technical Field

The present invention relates to wafer transfer, and more particularly to methods for transferring layers or substrates by controlling crack propagation.

2. Description of the Related Art

Wafer transfer processing is employed to transfer layers from one substrate to another. There is interest in processes that can separate a device layer from an underlying single crystal base substrate while leaving the base substrate smooth enough to not require a significant amount of polishing before the substrate is used again. In one process, an epitaxial lift-off procedure utilizes an AlAs separation layer between a base substrate (e.g., Ge or GaAs) and a III-V epitaxial device layer and separates the epitaxial layer from the base substrate layer by laterally etching the AlAs layer with HF. This approach is very time-consuming to the point that it is not practical for manufacturing, especially for large area wafers.

In another process, spalling is employed. In this approach, a metallic stress layer is deposited on a layer stack that includes a substrate, epitaxial buffer layer and a III-V device layer. The structure is then cracked by splitting the buffer layer, followed by a selective etch to remove buffer layer residuals from either side of the crack face. However, the depth of the crack can be difficult to control and it cannot always be confined to the buffer layer.

SUMMARY

A method for separating a layer for transfer includes forming a crack guiding layer on a substrate and forming a device layer on the crack-guiding layer. The crack guiding layer is weakened by exposing the crack-guiding layer to a gas which reduces adherence at interfaces adjacent to the crack guiding layer. A stress inducing layer is formed on the device layer to assist in initiating a crack through the crack guiding layer and/or the interfaces. The device layer is removed from the substrate by propagating the crack.

Another method for separating a layer for transfer includes growing a crack guiding layer on a monocrystalline substrate; forming a device layer on the crack-guiding layer, the device layer including crystalline III-V material; etching the crack guiding layer at exposed portions at a periphery to form a recess crack that assists in crack formation; weakening the crack guiding layer by exposing the crack-guiding layer to a gas which reduces adherence at interfaces adjacent to the crack guiding layer; forming a stress inducing layer on the device layer to further assist in initiating a crack through the crack guiding layer and/or the interfaces; and removing the device layer from the substrate by propagating the crack.

Yet another method for separating a layer for transfer includes growing a crack guiding layer on a monocrystalline substrate, the crack guiding layer including AlAs; forming a device layer on the crack-guiding layer; etching the crack guiding layer at exposed portions at a periphery to form a recess crack that assists in crack formation; weakening the crack guiding layer by exposing the crack-guiding layer to an oxidation agent which reduces adherence at interfaces adjacent to the crack guiding layer; forming a stress inducing layer on the device layer to further assist in initiating a crack through the crack guiding layer and/or the interfaces; and removing the device layer from the substrate by propagating the crack.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 1 is a cross-sectional view of a substrate employed in accordance with the present principles;

FIG. 2A is a cross-sectional view of the substrate of FIG. 1 having a crack guiding layer formed thereon in accordance with the present principles;

FIG. 2B is a cross-sectional view of the substrate of FIG. 1 having a protection layer and a crack guiding layer formed thereon in accordance with the present principles;

FIG. 3 is a cross-sectional view of the substrate of FIG. 2A having a device layer formed on the crack guiding layer in accordance with the present principles;

FIG. 4 is a cross-sectional view of the substrate of FIG. 3 having a stress-inducing layer formed on the device layer in accordance with the present principles;

FIG. 7 is a cross-sectional view showing a mechanism for weakening the crack guiding layer in accordance with the present principles;

FIG. 8 is a cross-sectional view showing the device layer separated from the crack guiding layer and a holder or handling substrate adhered to the stress-inducing layer in accordance with the present principles;

FIG. 9 is a cross-sectional view showing the substrate ready for reuse and the device layer ready for transfer to another layer or substrate in accordance with the present principles.

DETAILED DESCRIPTION OF PREFERRED EMBODIMENTS

Figure 6:
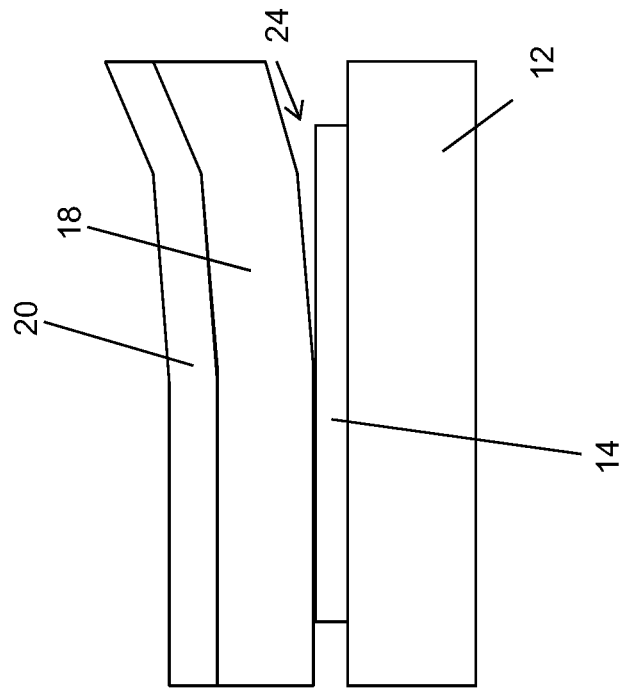
FIG. 6 is a cross-sectional view of the substrate of FIG. 5 showing a crack being propagated along the crack guiding layer and its interfaces with adjacent layers in accordance with the present principles.

In accordance with the present principles, a layer release process employs a stress layer, but utilizes a chemical reaction-induced degradation of adhesion of an epitaxial buffer layer. The adhesion-degrading reaction of the epitaxial buffer layer may be performed after an initial lateral recess etch or without an initial lateral recess etch. Layer separation is then induced by a spontaneous peeling at a weak interface rather than by the propagation of a crack or fracture, characteristic of spalling. In one embodiment, an AlAs layer or similar layer is employed and is oxidized by air, moisture, $H_2O_2$, $O_2$ or other compounds. For example, when AlAs is oxidized to $AlO_x$, the As will be "kicked out" to an interface with adjacent layers. This will weaken the interface and lead the crack to propagate along the AlAs layer. It should be noted that other materials and adherence reducing gas environments may also be employed.

In another embodiment, a crack guiding layer is inserted between a substrate and a device layer. The crack guiding layer may be selectively etched to partially recess the crack guiding layer relative to adjacent layers. The crack guiding layer may serve as a crack initiation control to determine and control a position for a cleavage interface. Then, a stress layer may be applied on the structure to form the crack, which can propagate along two interfaces of the crack guiding layer (e.g., AlAs). This process may be performed in the air or in an oxidizing environment to increase the oxidation rate of the crack guiding layer (to reduce adhesion). Materials other than those described in the examples may also be employed.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip or photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips or photovoltaic devices. The resulting chips/devices can be distributed by the fabricator in raw wafer form (that is, as a single wafer that has multiple unpackaged chips), as a bare die, or in a packaged form. In the latter case, the chip/device is mounted in a single chip package (such as a plastic carrier, with leads that are affixed to a motherboard or other higher level carrier) or in a multichip package (such as a ceramic carrier that has either or both surface interconnections or buried interconnections). In any case, the chip/device is then integrated with other chips, discrete circuit elements, and/or other signal processing devices as part of either (a) an intermediate product, such as a motherboard, or (b) an end product. The end product can be any product that includes integrated circuit chips or photovoltaic devices, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc. The photovoltaic devices may be large scale devices on the order of feet or meters in length and/or width, or may be small scale devices for use in calculators, solar powered lights, etc.

It should also be understood that material compounds will be described in terms of listed elements, e.g., AlAs, GaAs or InGaAs. These compounds include different proportions of the elements within the compound, e.g., InGaAs includes $In_xGa_yAs_{1-x-y}$, where x, y are less than or equal to 1, or AlAs includes $Al_xAs_{1-x}$ where x is less than or equal to 1, etc. In addition, other elements may be included in the compound, such as, e.g., AlInGaAs, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a substrate 12 or a stack of layers including or not including a substrate is provided. For ease of explanation, the substrate 12 will be described through the process flow. The substrate 12 may include a single crystal (monocrystalline) substrate. The substrate 12 may include, e.g., Ge, GaAs, InGaAs, InP, SiGe, Si, or other materials and may include an on-axis or off-cut wafer.

Referring to FIG. 2A, a crack guiding layer 14 is formed on the substrate 12. The crack guiding layer 14 may include a thickness of between about 100 nm to about 5 microns, although other thicknesses can be employed. Crack guiding layer 14 may include AlAs, AlGaAs, InAlAs, Ge or other materials that function in accordance with the present principles.

Referring to FIG. 2B, in one embodiment, in addition to the crack guiding layer 14, a protection layer 16 is formed on the substrate 12. The protection layer 16 is configured to protect the substrate 12 from damage during processing. The protection layer 16 may be epitaxially deposited on the substrate 12 and may include a monocrystalline substance, such as Ge or the like. Other materials for protection layer 16 may also be employed, such as, other monocrystalline materials (e.g., InGaAs, etc.), dielectric materials, etc. depending on the other material choices for the substrate 12 or other layers (crack guiding layer 14), etc. to be employed in the method. The protection layer 16 need not be thick, which will reduce processing time for its removal. The protection layer 16 may include a thickness of about 0.5 microns of less, although other thicknesses may be employed.

The crack guiding layer 14 is formed on the protection layer 16 and may include a thickness of between about 100 nm to about 5 microns, although other thicknesses can be employed. Crack guiding layer 14 may include AlAs, AlGaAs, InAlAs, Ge, etc.

Referring to FIG. 3, a device layer 18 is formed on the crack guiding layer 14. The protection layer 16 may be employed, but is not shown. The device layer 18 may include any material to be transferred to another substrate or layer. In one embodiment, the device layer 18 includes a III-V material. The III-V material may be monocrystalline. The device layer 18 is depicted as a single layer but may include multiple layers. The device layer 18 may be epitaxially grown or otherwise deposited on the crack guiding layer 14. In one embodiment, device layer 18 includes a layer that is lattice-matched with the crack guiding layer 14. The device layer 18 may be employed in the fabrication of integrated circuits, field effect transistor devices, photovoltaic cells, etc.

Referring to FIG. 4, a stress inducing layer 20 is formed on the device layer 18 over the entire wafer. The stress inducing layer 20 may include a metal, such as Ni, or may include a semiconductor material, such as SiGe, etc. Other materials may also be employed, such as W or Co.

Figure 5:
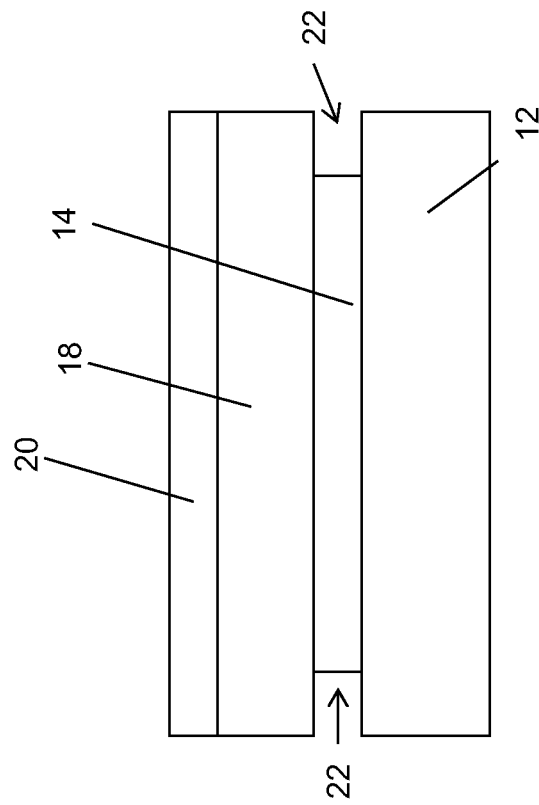
FIG. 5 is a cross-sectional view of the substrate of FIG. 4 showing the crack guiding layer recessed by etching in accordance with the present principles.

Referring to FIG. 5, in one embodiment, exposed edges of the crack guiding layer 14 may be etched with an appropriate etchant to pre-form a crack by forming recesses 22. In one embodiment, HF is employed as an etchant to etch, e.g., AlAs, although other etchants may be employed.

Referring to FIG. 6, a crack 24 is initiated by pulling or lifting an edge or from the stress of the stress inducing layer 20, which can be high enough to cause crack propagation. In one embodiment, the crack guiding layer 14 may be exposed to an oxidizing atmosphere to weaken the interfaces of the crack guiding layer 14 with the substrate 12 and/or the device layer 18. The oxidizing atmosphere may include exposure to air, steam, $H_2O_2$ or other oxidant to enhance the oxidation of the crack guiding layer 14, e.g., AlAs, and weaken the interface(s). The crack propagation is limited to the crack guiding layer 14 or the interfaces adjacent to the crack guiding layer 14.

Referring to FIG. 7, an explanation of the weakening mechanism is illustratively described for a cracking guidance layer 14 made of AlAs. Other materials may be employed as well. The AlAs is oxidized by air, moisture, $H_2O_2$, $O_2$ or other compounds. When AlAs is oxidized, $AlO_x$ is formed, and the liberated As moves toward the interfaces with adjacent layers. This weakens the interface and leads the crack to propagate along the cracking guidance layer 14 and/or the interfaces.

Referring to FIG. 8, after separating the substrate 12 from the device layer 18 using the crack guiding layer 14, the crack guiding layer 14 is removed from the substrate 12. If a protection layer (16) is employed, the protection layer may be removed as well.

The crack guiding layer 14 may be etched using HF or other etchant. The device layer 18 may be transferred to other holders or substrates 26, such as glass, metal, etc. for the following fabrication steps. It should be understood that a holder or substrate 26 may be attached to the stress inducing layer 20 prior to the crack propagation/separation step.

In FIG. 9, separated portions are shown with the substrate 12 ready for reuse for a next process, and the device layer 18 ready for transfer to another layer, stack of layers or substrate.

Figure 10:
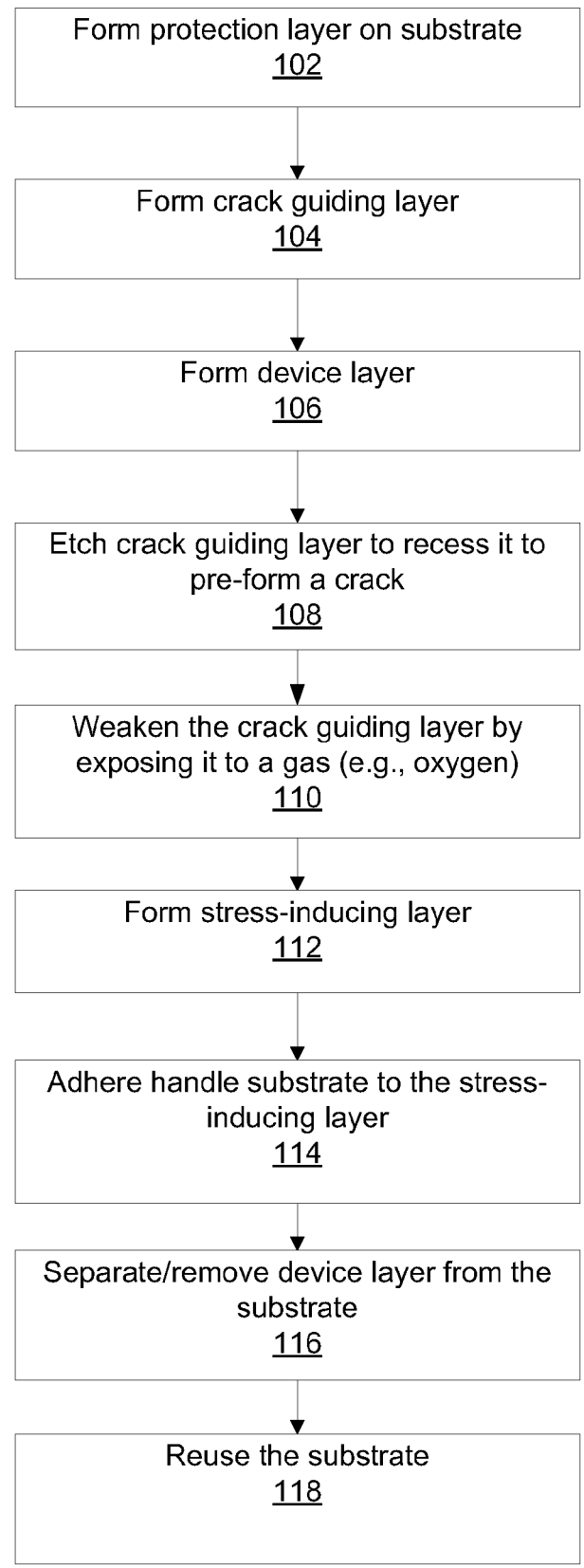
FIG. 10 is a block/flow diagram showing a method for separating a layer for transfer in accordance with illustrative embodiments.

Referring to FIG. 10, a method for separating a layer for transfer is illustratively shown. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 102, a protection layer is optionally formed on a substrate. In one embodiment, the protection layer includes Ge on a GaAs substrate. In block 104, a crack guiding layer is formed on the substrate. The crack guiding layer may include, e.g., AlAs and the device layer may include, e.g., a III-V material. These layers may be formed by employing an epitaxial deposition process.

In block 106, a device layer is formed on the crack guiding layer. In block 108, the crack guiding layer may be etched at exposed portions at a periphery of the device stack to preform a crack. The crack guiding layer is recessed to form a natural stress riser. In block 110, the crack guiding layer is weakened by exposing the crack-guiding layer to a gas which reduces adherence at interfaces adjacent to the crack guiding layer. Weakening the crack guiding layer may include exposing the crack guiding layer to oxygen or a compound including oxygen. This is particularly useful when the crack guiding layer includes AlAs.

In block 112, a stress inducing layer is formed on the device layer to assist in initiating a crack through the crack guiding layer and/or the interfaces. The stress inducing layer may include depositing Ni, SiGe, W, Co or other material. In block 114, a holder or substrate may be adhered to the stress inducing layer to enable transport for transferring the device layer, once removed. In block 116, the device layer is removed from the substrate by propagating the crack. In block 118, the substrate may be reused for further processing after the crack guiding layer is removed. Processing can continue.

Having described preferred embodiments for crack control for substrate separation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for separating a layer for transfer, comprising:
   forming a crack guiding layer on a surface of a substrate;
   forming a device layer on the crack guiding layer;
   weakening the crack guiding layer by exposing the crack guiding layer to a gas which reduces adherence at interfaces adjacent to the crack guiding layer;
   forming a stress inducing layer on the device layer to assist in initiating a crack through the crack guiding layer and/or the interfaces; and
   removing the device layer from the substrate by propagating the crack.

2. The method as recited in claim 1, wherein the crack guiding layer includes AlAs and the device layer includes a III-V material.

3. The method as recited in claim 1, wherein weakening the crack guiding layer includes exposing the crack guiding layer to oxygen or a compound including oxygen.

4. The method as recited in claim 1, further comprising etching the crack guiding layer at exposed portions on a periphery to pre-form the crack.

5. The method as recited in claim 1, wherein forming the stress inducing layer includes depositing one of Ni, W, Co and SiGe.

6. The method as recited in claim 1, further comprising forming a protection layer on the substrate before forming the crack guiding layer.

7. The method as recited in claim 1, further comprising applying a holder substrate to the device layer to enable transport for transferring the device layer.

8. The method as recited in claim 1, further comprising reusing the substrate for further processing.

9. A method for separating a layer for transfer, comprising:
    growing a crack guiding layer on a surface of a monocrystalline substrate;
    forming a device layer on the crack guiding crack guiding layer, the device layer including crystalline III-V material;
    etching the crack guiding layer at exposed portions at a periphery to form a recess crack that assists in crack formation;
    weakening the crack guiding layer by exposing the crack guiding layer to a gas which reduces adherence at interfaces adjacent to the crack guiding layer;
    forming a stress inducing layer on the device layer to further assist in initiating a crack through the crack guiding layer and/or the interfaces; and
    removing the device layer from the substrate by propagating the crack.

10. The method as recited in claim 9, wherein the crack guiding layer includes AlAs.

11. The method as recited in claim 9, wherein weakening the crack guiding layer includes exposing the crack guiding layer to oxygen or a compound including oxygen.

12. The method as recited in claim 9, wherein forming the stress inducing layer includes depositing one of Ni, W, Co and SiGe.

13. The method as recited in claim 9, further comprising forming a protection layer on the substrate before forming the crack guiding layer.

14. The method as recited in claim 9, further comprising applying a holder substrate to the device layer to enable transport from transferring the device layer.

15. The method as recited in claim 9, farther comprising reusing the substrate for further processing.

16. A method for separating a layer for transfer, comprising:
    growing a crack guiding layer on a monocrystalline substrate, the crack guiding layer including AlAs;
    forming a device layer on the crack guiding layer;
    etching the crack guiding layer at exposed portions at a periphery to form a recess crack that assists in crack formation;
    weakening the crack guiding layer by exposing the crack guiding layer to an oxidation agent which reduces adherence at interfaces adjacent to the crack guiding layer;
    forming a stress inducing layer on the device layer to further assist in initiating a crack through the crack guiding layer and/or the interfaces; and
    removing the device layer from the substrate by propagating the crack.

17. The method as recited in claim 16, wherein forming the stress inducing layer includes depositing one of Ni, W, Co and SiGe.

18. The method as recited in claim 16, further comprising forming a protection layer on the substrate before forming the crack guiding layer.

19. The method as recited in claim 16, further comprising applying a holder substrate to the device layer to enable transport from transferring the device layer.

20. The method as recited in claim 16, further comprising reusing the substrate for further processing.

* * * * *